United States Patent
Ho et al.

(10) Patent No.: US 7,473,088 B2
(45) Date of Patent: Jan. 6, 2009

(54) MICROIMPRINT/NANOIMPRINT DEVICE

(75) Inventors: Yu-Lun Ho, Hsinchu (TW); Lai-Sheng Chen, Hsinchu (TW); Wei-Han Wang, Hsinchu (TW); Jen-Hua Wu, Hsinchu (TW); Chuan-Feng Chen, Hsinchu (TW); Shou-Ren Chen, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 277 days.

(21) Appl. No.: 11/242,067

(22) Filed: Oct. 4, 2005

(65) Prior Publication Data

US 2006/0198917 A1    Sep. 7, 2006

(30) Foreign Application Priority Data

Mar. 2, 2005   (TW) .............................. 94106200 A

(51) Int. Cl.
    *B29C 43/02*    (2006.01)
(52) U.S. Cl. .................... 425/174.4; 425/193; 425/384; 425/385
(58) Field of Classification Search .............. 425/174.4, 425/193, 385, 174.2, 174.8 R, 384, 174
    See application file for complete search history.

(56) References Cited

U.S. PATENT DOCUMENTS

| | | | | |
|---|---|---|---|---|
| 6,121,130 A | * | 9/2000 | Chua et al. ................. | 438/623 |
| 6,482,742 B1 | * | 11/2002 | Chou ......................... | 425/385 |
| 6,858,308 B2 | * | 2/2005 | Kondo et al. ............... | 428/446 |
| 7,070,405 B2 | * | 7/2006 | Sreenivasan et al. ...... | 425/174.4 |
| 7,070,406 B2 | * | 7/2006 | Jeans ....................... | 425/174.4 |
| 7,327,439 B2 | * | 2/2008 | Zaal et al. .................. | 456/290 |

FOREIGN PATENT DOCUMENTS

| | | |
|---|---|---|
| JP | 2000-194142 A | 7/2000 |
| JP | 2002-093748 A | 3/2002 |
| JP | 2004-288804 A | 10/2004 |
| JP | 2005-101201 A | 4/2005 |

\* cited by examiner

*Primary Examiner*—Yogendra Gupta
*Assistant Examiner*—Thu Khanh T Nguyen
(74) *Attorney, Agent, or Firm*—Birch, Stewart, Kolasch & Birch, LLP

(57) ABSTRACT

A microimprint/nanoimprint device includes a mold, a substrate and an energy transferring module. The substrate is disposed oppositely to the mold and at least has a molding material layer. The energy transferring module includes an energy transferring member and at least one energy source, wherein the energy transferring member is connected to the substrate or the mold, and the energy source provides imprint energy to the substrate or the mold, such that at least part of the imprint energy goes through the energy transferring member to the substrate or the mold for performing imprint molding.

11 Claims, 5 Drawing Sheets

MICROIMPRINT/NANOIMPRINT DEVICE

FIELD OF THE INVENTION

The present invention relates to imprint devices, and more particularly, to a microimprint/nanoimprint device.

BACKGROUND OF THE INVENTION

In the past decade, the semiconductor industry has played a very important role in the global economy, by which exploitation and application of various kinds of micro electro mechanical products are promoted along with development of the semiconductor technology. However, as the line width and line pitch processed for various kinds of products are continuously decreased to smaller than 100 nanometers, the current photo-lithography technology encounters a physical problem in optical imaging, and the fabrication difficulty and costs of fabrication equipment are also greatly increased. Although a next-generation lithography technology has been proposed, it still has problems of high equipment costs and low yields. Consequently, the most popular lithography technology at present is nanoimprint lithography (NIL) technology, which is not restricted by diffraction limitation of optical lithography, and has advantages such as high lithography resolution, fast fabrication speed, low production costs and so on.

Generally, thermal compression molding process and ultraviolet curing process are primary nanoimprint technologies at present. The thermal compression molding process is to imprint mold patterns to a substrate coated with a polymer material under high temperature and high pressure, and the ultraviolet curing process uses ultraviolet irradiation to cure and mold microstructures under normal temperature and normal pressure. As the molding techniques and fabrication conditions of these two processes are different, corresponding independent system modules thereof are mostly provided in the current design of devices. The related prior art patents include WO 2004/016406, U.S. Pat. No. 6,482,742, and WO 2004/114017A1, etc.

For example, WO 2004/016406 discloses a microimprint/nanoimprint device using the ultraviolet curing technology as shown in FIGS. 4A and 4B. Referring to FIG. 4A, the microimprint/nanoimprint device comprises a power source 301, an imprint unit carrier 302, an imprint unit 303, an ultraviolet module 304, a mold 305, a substrate 306, a substrate carrier 307, a movable feeding platform 308, and a platform carrier 309. As shown in FIG. 4B, the imprint unit 303 comprises a self adjusting mechanism 3031 for adjusting parallelism between the mold 305 and the substrate 306. The ultraviolet module 304 comprises an ultraviolet source 3041 and a refractor 3042.

During imprinting, the power source 301 drives the imprint unit 303 to move downwardly, allowing the mold 305 to be in contact with the substrate 306, wherein the self adjusting mechanism 3031 adjusts and keeps parallelism between the mold 305 and the substrate 306. The ultraviolet source 3041 of the ultraviolet module 304 provides ultraviolet energy with appropriate power that is transferred via the refractor 3042 so as to cure a molding material between the mold 305 and the substrate 306.

However, since the power source and the ultraviolet source are located at the same side of the microimprint/nanoimprint device, in order to prevent any interference in arrangement between the ultraviolet source, the power source and other components such as a mold clamping mechanism, it is necessary to employ a complicated design of optical mechanism allowing ultraviolet from the ultraviolet source to be laterally inputted and then transferred via the refractor such that the ultraviolet energy can be transmitted to the molding material. This not only complicates the design of ultraviolet source but also greatly increases the device costs.

Further, the microimprint/nanoimprint device may only be applied to a small area imprinting process. In the case for achieving large area imprinting, the microimprint/nanoimprint device must repeatedly perform the imprinting process periodically. Consequently, this conventional technology prolongs a product fabrication period of time and may affect the product yields directly due to errors of alignment precision between the periods.

Another microimprint/nanoimprint device capable of performing both thermal compression molding and ultraviolet curing processes has been proposed as in U.S. Pat. No. 6,482,742 for example. U.S. Pat. No. 6,482,742 discloses a fluid pressure imprint lithography device as shown in FIGS. 5A and 5B. The fluid pressure imprint lithography device comprises a sealing chamber 401, a fluid entrance 402 formed at two opposite sides of the sealing chamber 401 respectively, a mold 403, a substrate 405 coated with a molding material 404, a sealing envelope 406 for encapsulating the mold 403 and the substrate 405, a heating unit 407 provided in the sealing chamber 401, and a light penetrable window 408 provided at a top side of the sealing chamber 401.

During imprinting, the mold 403 and the substrate 405 are encapsulated by the sealing envelope 406 and then placed into the sealing chamber 401. The substrate 405 is heated to a predetermined molding temperature by the heating unit 407, and then a fluid (not shown) is filled from the fluid entrances 402 to exert pressure to the mold 403 so as to perform the thermal compression molding process. When the fluid exerts pressure to the mold 403, an external ultraviolet source (not shown) may be used to irradiate the molding material 404 on the substrate 405 via the light penetrable window 408 to perform the ultraviolet curing process. Therefore, an imprint molding process of nanostructures can be performed by such design having both functions of thermal compression molding and ultraviolet curing.

However, when employing the fluid pressure imprint lithography device disclosed in U.S. Pat. No. 6,482,742, it must spend time on changing system modules, thereby increasing the device costs. Further, the mold and the substrate should be stacked and sealed before imprinting, and the sealing envelope should be removed after imprint molding to unseal the mold and the substrate and perform a mold releasing process. This increases processing costs before and after imprinting, and makes control of the fabrication processes not continuous, thereby prolonging a molding period and not favorable for mass production.

Moreover, the sealing envelope generally has relatively poorer light penetrability, such that when ultraviolet needs to go through the light penetrable window and the sealing envelope, the ultraviolet energy is apt to be absorbed during transmission or even becomes scattered. As this conventional technology cannot control the provided ultraviolet energy and cannot obtain a uniformly imprinted product, the molding quality of the molding material would be affected.

Therefore, it is greatly desirable to develop a microimprint/nanoimprint device, capable of solving the problems in the foregoing conventional technology such as high costs, low yields, poor quality and unfavorable for mass production, which are caused by the drawbacks such as having a complicated design of light source mechanism, high equipment costs, small imprinting area, increased processing costs, discontinuous control of fabrication processes, a prolonged molding period, and difficulty in controlling the molding quality.

SUMMARY OF THE INVENTION

In light of the drawbacks in the foregoing conventional technology, an objective of the present invention is to provide a microimprint/nanoimprint device, which provides a function of performing different imprinting processes and simplifies the structure thereof.

Another objective of the present invention is to provide a microimprint/nanoimprint device, which can complete large area imprinting at a time and thus increases the production yields.

Still another objective of the present invention is to provide a microimprint/nanoimprint device, which can perform uniform imprinting and thus improves the molding quality.

A further objective of the present invention is to provide a microimprint/nanoimprint device for reducing the device costs.

A further objective of the present invention is to provide a microimprint/nanoimprint device for shortening a molding period.

A further objective of the present invention is to provide a microimprint/nanoimprint device for providing flexibility in design.

In accordance with the above and other objectives, the present invention proposes a microimprint/nanoimprint device comprising a mold, a substrate and an energy transferring module. The mold has feature structures sized smaller than 100 microns, and the mold is selectively a light penetrable mold. The substrate is arranged oppositely to the mold, and the substrate is at least formed with a molding material layer. The substrate is preferably a silicon substrate, a glass substrate or any of other light penetrable substrates. The energy transferring module comprises an energy transferring member and at least one energy source, wherein the energy transferring member is connected to the substrate, and the energy source provides imprint energy to the molding material layer of the substrate, such that at least part of the imprint energy goes through the energy transferring member to the molding material layer to perform different imprint molding processes on the molding material layer.

In a preferred embodiment, the microimprint/nanoimprint device comprises two energy sources including an ultraviolet source and a heating source, wherein the ultraviolet source and the heating source can be disposed at the same side or at different sides. In another preferred embodiment, the microimprint/nanoimprint device comprises one energy source such as an ultraviolet source or a heating source.

Preferably, the ultraviolet source provides light having a wavelength between $10 \times 10^{-9}$ and $400 \times 10^{-9}$ meters. The heating source is at least one selected from the group consisting of an electromagnetic wave source, an electrothermal heating source, an optical radiation heating source, and an induction heating source. The electromagnetic wave source preferably provides electromagnetic wave having a frequency between 300 KHz and 300 GHz.

The energy transferring member is made of an energy penetrable material. Preferably, the energy transferring member is made of a partly light penetrable material or a completely light penetrable material. More preferably, the energy transferring member is made of at least one selected from the group consisting of quartz, glass, polymer and ceramic.

As the energy transferring member made of the energy penetrable material is connected to the substrate or the mold in the present invention, the energy source can utilize a simple arrangement structure to provide irradiation, to thereby prevent any interference between the energy source, a power source and other components such as a mold clamping mechanism. Consequently, the present invention provides a microimprint/nanoimprint device having a simple structure and a function of performing different imprinting processes, which can solve the problems in the foregoing conventional technology such as high costs, low yields, poor quality and unfavorable for mass production due to the drawbacks such as having a complicated design of light source mechanism, high equipment costs, small imprinting area, increased processing costs, discontinuous control of fabrication processes, a prolonged molding period, and difficulty in controlling the molding quality. The present invention can achieve large area imprinting at a time and perform uniform imprinting, thereby increasing the product yields, improving the molding quality, reducing the device costs, shortening a molding period, and providing flexibility in the device design, such that the industrial applicability is improved.

BRIEF DESCRIPTION OF THE DRAWINGS

The present invention can be more fully understood by reading the following detailed description of the preferred embodiments, with reference made to the accompanying drawings, wherein:

FIGS. 4A and 4B (PRIOR ART) are schematic diagrams of a microimprint/nanoimprint device disclosed in WO 2004/016406, wherein FIG. 4A shows the entire structure of the microimprint/nanoimprint device, and FIG. 4B is an enlarged view showing a relationship in arrangement between a mold, a substrate and a sealing envelope; and FIGS. 5A and 5B (PRIOR ART) are schematic diagrams of a fluid pressure imprint lithography device disclosed in U.S. Pat. No. 6,482,742, wherein FIG. 5A shows the entire structure of the fluid pressure imprint lithography device, and FIG. 5B is an enlarged view showing a light source mechanism of the device.

DETAILED DESCRIPTION OF THE PREFERRED EMBODIMENTS

Preferred embodiments of a microimprint/nanoimprint device proposed in the present invention are described in detail as follows with reference to FIGS. 1 to 3, which are not for limiting the scope of the present invention.

First Preferrred Embodiment

Figure 1:
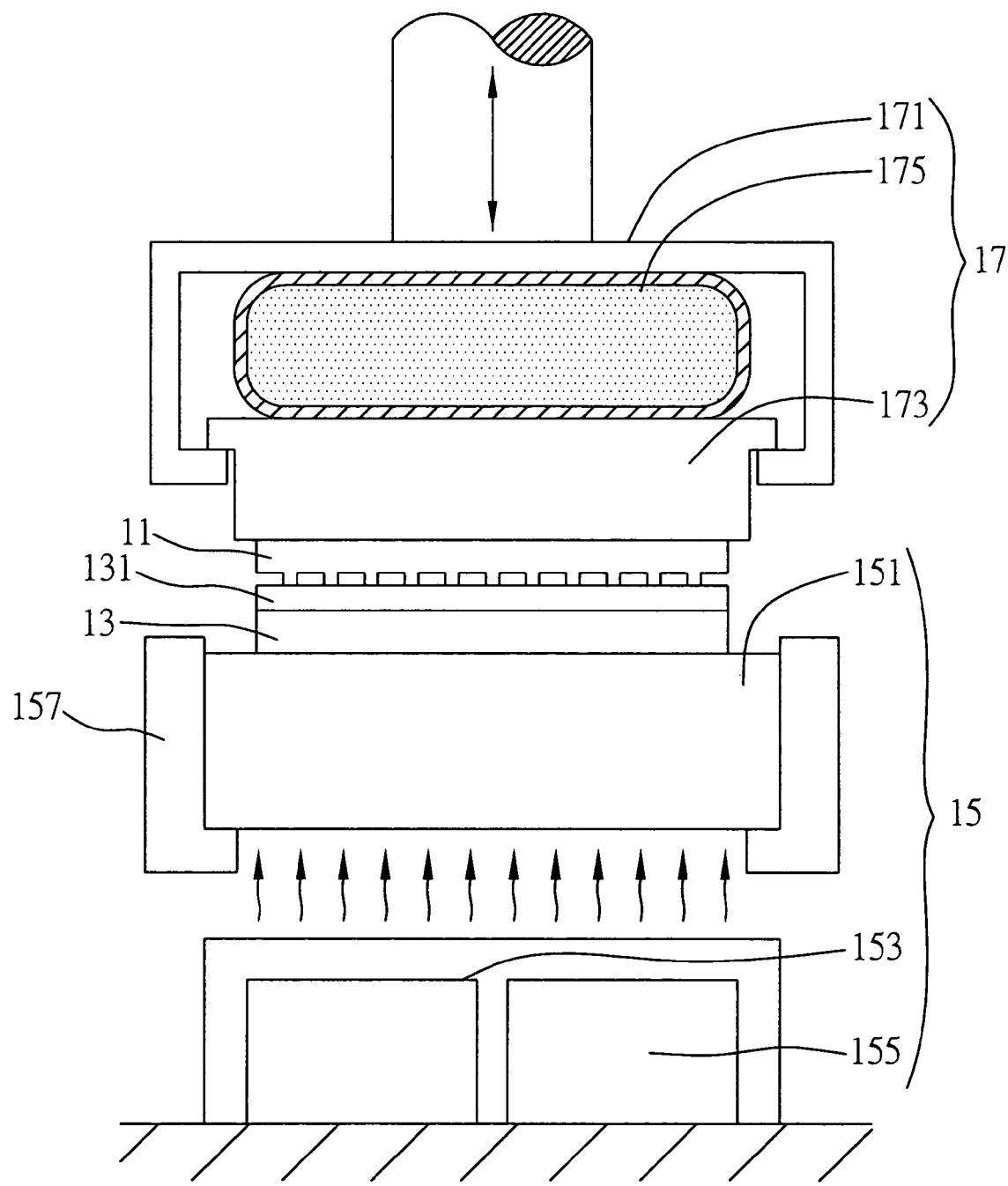
FIG. 1 is a schematic diagram of a microimprint/nanoimprint device according to a first preferred embodiment of the present invention.

FIG. 1 is a schematic diagram of the microimprint/nanoimprint device according to a first preferred embodiment of the present invention. It should be noted that, the microimprint/nanoimprint device in the present invention is applied for imprinting microstructures/nanostructures. The following embodiments exemplify fabrication of feature structures such as microstructures having a size smaller than 100 microns and nanostructures by using the microimprint/nanoimprint device; however, the present invention is not limited to this arrangement. Since conventional microstructures/nanostructures are used in the present invention and are not modified in structure, for the sake of simplicity and clarifying the technical features and structures of the present invention, only structures directly relating to the present invention are shown in the drawings, and the other parts are omitted.

As shown in FIG. 1, the microimprint/nanoimprint device comprises a mold 11, a substrate 13, and an energy transferring module 15.

The mold 11 has feature structures sized smaller than 100 microns. The substrate 13 is arranged oppositely to the mold 11, and is at least formed with a molding material layer 131. The energy transferring module 15 comprises an energy transferring member 151 and two energy sources 153, 155. The energy transferring member 151 is connected to the substrate 13, and is made of an energy penetrable material. Preferably, the energy transferring member 151 is selectively made of a partly light penetrable material or a completely light penetrable material. More preferably, the energy transferring member 151 is made of quartz, glass, polymer, ceramic or any of other equivalent materials. The energy sources 153, 155 can be an ultraviolet source and a heating source, respectively.

A power mechanism 17 is provided on the mold 11 and is connected to a power source (not shown) for driving the power mechanism 17 and the mold 11 to move downwardly. In this embodiment, the power mechanism 17 comprises a holding member 171 connected to the power source; a pressing member 173 held by the holding member 171 and capable of being in contact with the mold 11; and a uniform pressing member 175 disposed in the holding member 171 and capable of being in contact with the pressing member 173. It should be understood that other power mechanisms that can be adjusted to exert high pressure and/or normal pressure for performing uniform imprinting are also suitably used in the present invention, and the present invention is not limited to the arrangement in this embodiment.

When performing an ultraviolet curing process, the power source drives the power mechanism 17 and the mold 11 to move downwardly to allow the mold 11 to press the substrate 13 until the mold 11 is fully in contact with the molding material layer 131 on the substrate 13, and when appropriate pressure is produced between the mold 11 and the molding material layer 131, the movement is immediately stopped and a pressure applying stage is maintained. The energy source 153 such as an ultraviolet source can output appropriate energy, wherein the ultraviolet source may be, but not limited to, a light source providing light having a wavelength between $10 \times 10^{-9}$ and $400 \times 10^{-9}$ meters. As such, imprint energy provided by the energy source 153 can be transferred to the molding material layer 131 on the substrate 13 via the energy transferring member 151 connected to the substrate 13 so as to perform an imprint molding process on the molding material layer 131.

When performing a thermal compression molding process, similarly the power source drives the power mechanism 17 and the mold 11 to move downwardly to allow the mold 11 to press the substrate 13 until the mold 11 is fully in contact with the molding material layer 131 on the substrate 13, and when appropriate pressure is produced between the mold 11 and the molding material layer 131, the movement is immediately stopped and a pressure applying stage is maintained. It is different from the above ultraviolet curing process in that, the energy source 155 such as a heating source can output appropriate energy, wherein the heating source may be one selected from the group consisting of an electromagnetic wave source, an electrothermal heating source, an optical radiation heating source, an induction heating source, any of other equivalent heating sources, and a combination thereof, for outputting the appropriate energy. In the case of using an electromagnetic wave source, the electromagnetic wave source preferably provides electromagnetic wave having a frequency between 300 KHz and 300 GHz as a heating source; however, the present invention is not limited to this arrangement. As such, imprint energy provided by the energy source 155 can be transferred to the molding material layer 131 on the substrate 13 via the energy transferring member 151 connected to the substrate 13 so as to perform an imprint molding process on the molding material layer 131.

It should be understood that the fabrication conditions of using normal temperature and normal pressure in the ultraviolet curing process and the fabrication conditions of using high temperature and high pressure in the thermal compression molding process are known in the art and not to be further described herein.

Although in this embodiment, the energy sources 153, 155 are arranged at the same side and both under the energy transferring member 151, a switch mechanism (not shown) can be additional provided in other embodiments to adjust and arrange the energy source 153 or the energy source 155 to be located under the energy transferring member 151, to allow an appropriate energy source to be used in accordance with requirements. Further, this embodiment uses a carrier 157 for mounting the energy transferring member 151; however, a structure for disposing the energy transferring member 151 is not limited to such arrangement but any structure not intervening in energy transfer of the energy sources 153, 155 is suitably applied in the present invention.

In this embodiment, the substrate 13 may be a light penetrable substrate such that the ultraviolet energy transferred by the energy transferring member 151 is transferred to the molding material layer 131 via the substrate 13. However in other embodiments, a light penetrable mold 11 may be used, and positions of the mold 11 and the substrate 13 are exchanged, such that the ultraviolet energy transferred by the energy transferring member 151 is transferred to the molding material layer 131 via the mold 11. Therefore, by connecting the energy transferring member 15 to the substrate 13 or the mold 11, and allowing the energy source 153 or the energy source 155 to provide the imprint energy to the substrate 13 or the mold 11, at least part of the imprint energy goes through the energy transferring member 151 to the substrate 13 or the mold 11 to thereby perform different imprint molding processes.

Compared to the conventional technology having drawbacks such as having a complicated design of light source mechanism, high equipment costs, small imprinting area, increased processing costs, discontinuous control of fabrication processes, a prolonged molding period, and difficulty in controlling the molding quality, the present invention provides a microimprint/nanoimprint device that prevents any interference in arrangement between an energy source, a power source and other components such as a mold clamping mechanism, and allows an energy-penetrable energy transferring member to be selectively connected to the substrate or the mold, such that the energy source can employ a simple and flexible arrangement structure to provide irradiation, making the present invention have both a simple structure and a function of performing different imprinting processes.

As the present invention does not have limitation of lateral light input from a light source as in the conventional technology, large area imprinting can be performed at a time and appropriate pressure can be exerted for uniform imprinting in the present invention. The present invention does not have the drawbacks such as high processing costs, discontinuous control of fabrication processes and a prolonged molding period caused by the use of a sealing envelope as in the conventional technology, such that the present invention is favorable for mass production.

The design of the present invention at least satisfies the fabrication conditions required for the ultraviolet curing and thermal compression molding processes. Besides capable of adjusting the energy source according to the fabrication requirements and having the function of performing different imprinting processes, the present invention also can flexibly exchange positions of the substrate and the mold, thereby having better flexibility than the conventional technology.

Therefore, the present invention can provide a microimprint/nanoimprint device having a simple structure and a function of performing different imprinting processes to solve the problems caused by the conventional technology, thereby improving the quality of a nanostructure product and the industrial applicability of the device.

Second Preferred Embodiment

Figure 2:
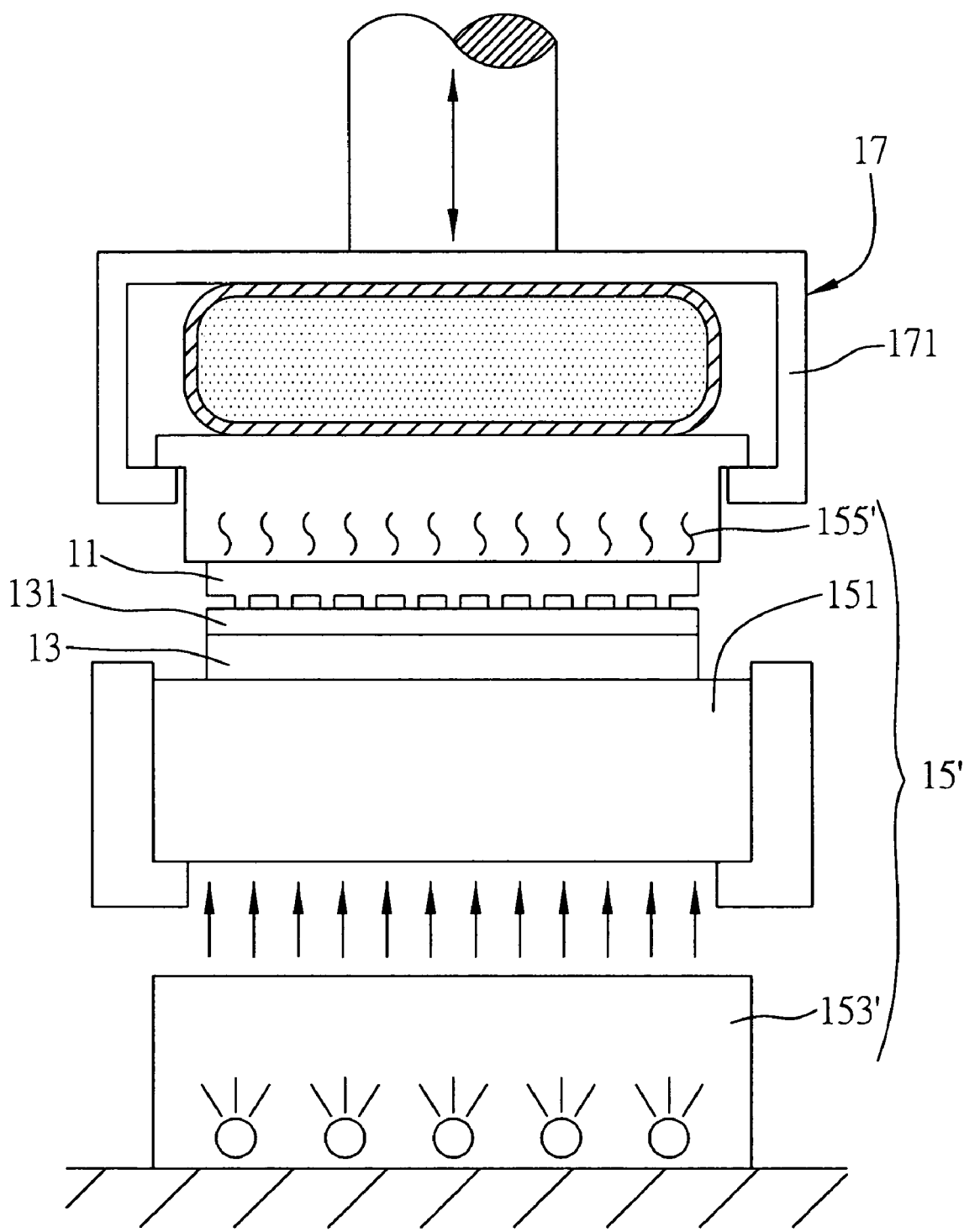
FIG. 2 is a schematic diagram of the microimprint/nanoimprint device according to a second preferred embodiment of the present invention.

FIG. 2 is a schematic diagram of the microimprint/nanoimprint device according to a second preferred embodiment of the present invention, wherein same or similar elements as or to those in the first embodiment are designated with same or similar reference numerals and detailed descriptions thereof are omitted for the sake of clarify.

The second embodiment primarily differs from the first embodiment in that, the first embodiment uses an energy transferring module comprising two energy sources arranged at the same side, but the second embodiment uses an energy transferring module comprising two energy sources arranged at different sides for example at opposite sides.

As shown in FIG. 2, the microimprint/nanoimprint device in this embodiment comprises a mold 11, a substrate 13 and an energy transferring module 15'. The energy transferring module 15' comprises the energy transferring member 151, an energy source 153' and an energy source 155', wherein the energy source 153' can be an ultraviolet source, and the energy source 155' can be a heating source capable of clamping the mold 11. The energy source 155' may be disposed at the holding member 171 of the power mechanism 17 such that the pressing member 173 for contacting the mold 11 in the first embodiment is omitted.

When performing an ultraviolet curing process, the energy source 153' located under the energy transferring member 151 may output appropriate energy, such that imprint energy provided by the energy source 153' is transferred to the molding material layer 131 on the substrate 13 via the energy transferring member 151 connected to the substrate 13. When performing a thermal compression molding process, the energy source 155' located on the mold 11 may output appropriate energy, such that imprint energy provided by the energy source 155' is transferred to the molding material layer 131 on the substrate 13 via the energy transferring member 151 connected to the substrate 13. It should be understood that positions of the mold 11 and the substrate 13 can be exchanged, and any arrangement thereof capable of transferring the energy to the molding material layer 131 to perform imprint molding on the molding material layer 131 is suitably used in the present invention and belongs to modification that can be easily anticipated by those skilled in the art.

Third Preferred Embodiment

Figure 3:
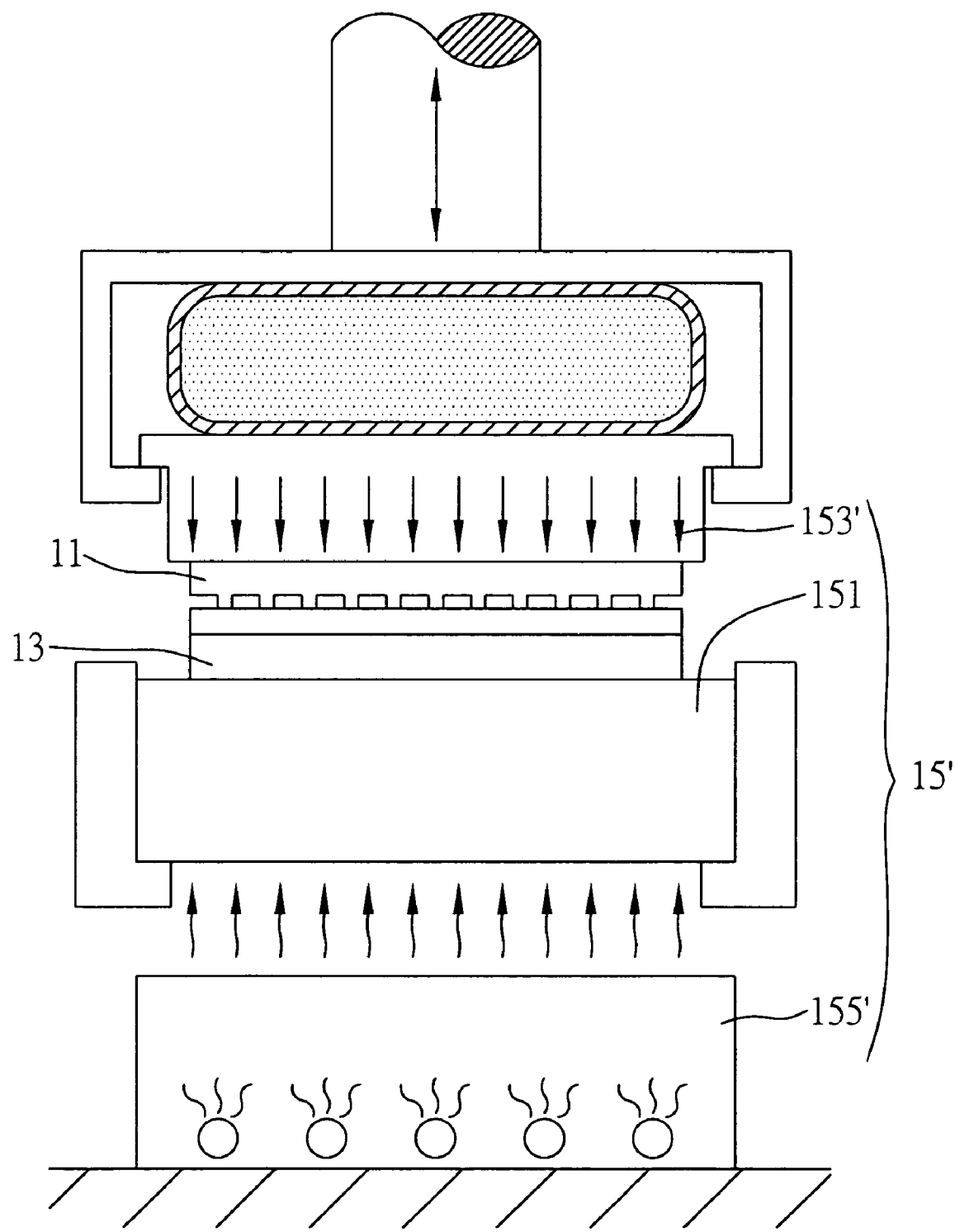
FIG. 3 is a schematic diagram of the microimprint/nanoimprint device according to a third preferred embodiment of the present invention.
Figure 4A:
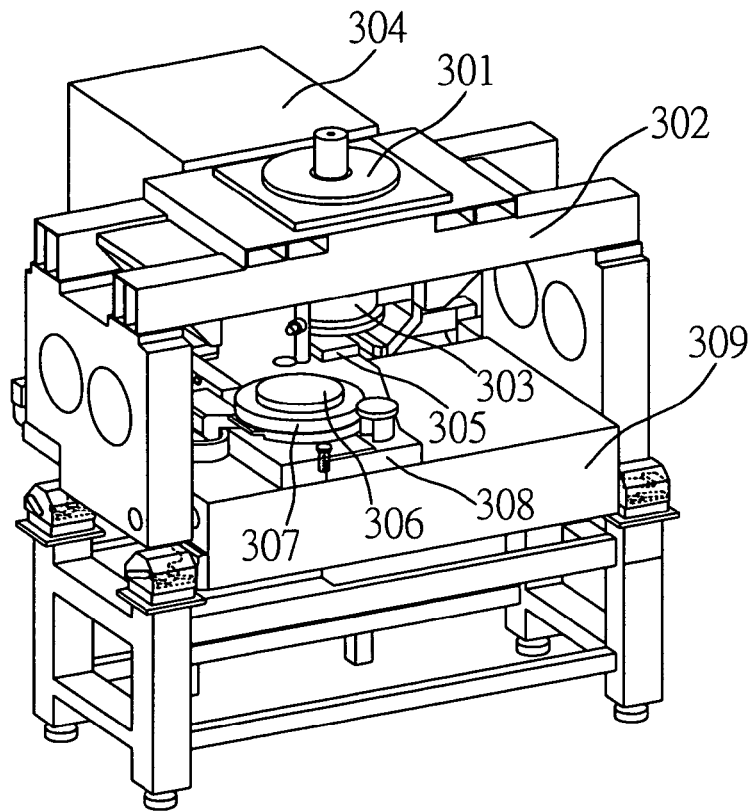
Figure 4B:
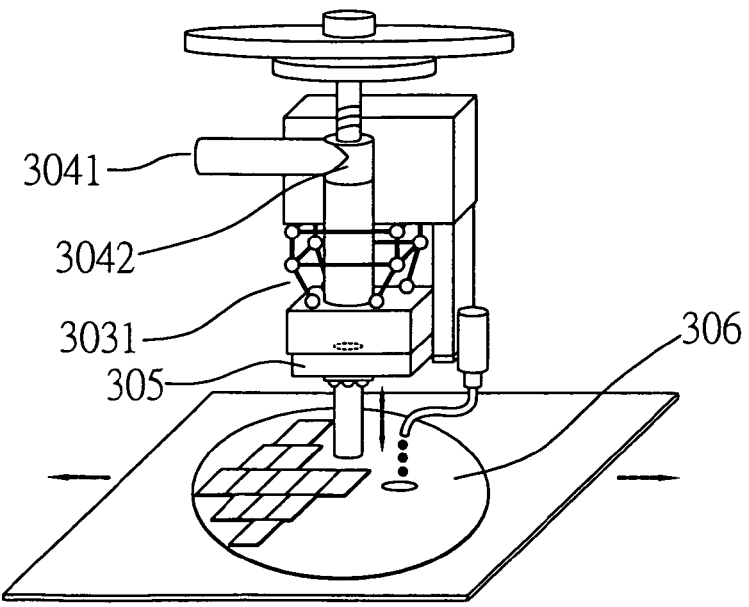
Figure 5A:
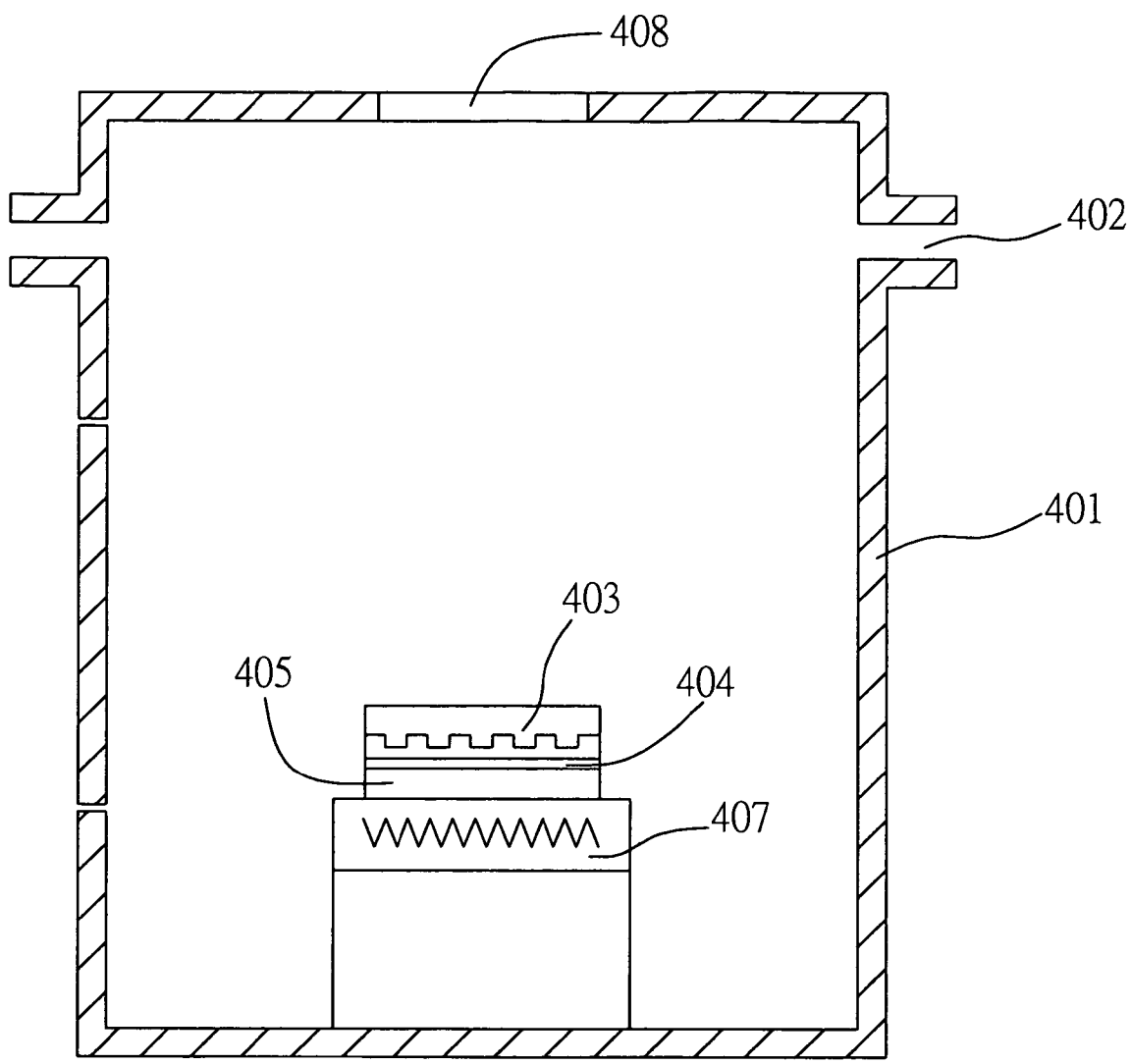
Figure 5B:
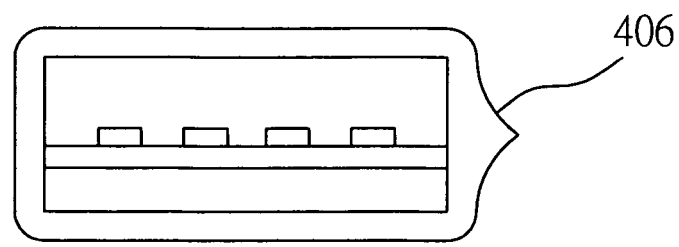

FIG. 3 is a schematic diagram of the microimprint/nanoimprint device according to a third preferred embodiment of the present invention, wherein same or similar elements as or to those in the first embodiment are designated with same or similar reference numerals and detailed descriptions thereof are omitted.

The third embodiment primarily differs from the second embodiment in that, in the second embodiment, the energy source 153' such as an ultraviolet source is located under the energy transferring member 151 and the energy source 155' such as a heating source is located on the mold 11; however in the third embodiment, positions of the energy source 153' and the energy source 155' in the second embodiment are exchanged.

As shown in FIG. 3, in this embodiment, the energy source 155' such as a heating source of the energy transferring module 15' is provided under the energy transferring member 151, and the energy source 153' such as an ultraviolet source is provided on the mold 11. The mold 11 such as a light penetrable mold can be used to transfer ultraviolet. It should be understood that, positions of the mold 11 and the substrate 13 can be exchanged, and the substrate 13 such as a light penetrable substrate can be employed to transfer ultraviolet, which belong to modification that can be easily anticipated by those skilled in the art.

Therefore, the energy-penetrable energy transferring member is connected to the mold such as a light penetrable mold or the substrate such as a light penetrable substrate, which allows an ultraviolet curing process to be performed using simply irradiation arrangement, without a problem of having interference between the energy source and the power source as in the conventional technology, and also allows a thermal compression molding process to be performed, thereby providing effects of both thermal compression and ultraviolet imprint molding. Further, by cooperation between the uniform pressing member with the pressing member or the energy source capable of clamping the mold, large area imprinting can be accomplished at a time and uniform imprinting can be achieved, without causing the drawbacks such as increase costs before and after processing and the prolonged molding period as in the conventional technology. Moreover, positions of the mold and the substrate, and positions of different energy sources, can be exchanged, such that a user can perform modification according to requirements without any difficulty.

In conclusion, the microimprint/nanoimprint device in the present invention not only provides a function of performing different imprinting processes and simplifies the structure thereof, but also achieves large area imprinting at a time to increase the production yields, as well as performs uniform imprinting to improve the molding quality, such that the device costs are reduced and a molding period is shortened. Thus, the present invention solves various drawbacks in the conventional technology, and has flexibility in design and effectively improves the industrial applicability thereof.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A microimprint/nanoimprint device comprising:
a mold;
a substrate disposed oppositely to the mold and at least having a molding material layer; and
an energy transferring module comprising an energy transferring member, an ultraviolet source, a heating source and a switching mechanism for selecting the ultraviolet source or the heating source as an energy source, the energy transferring member being connected to the substrate, and the energy source for providing imprint energy to the molding material layer of the substrate, so as to allow at least part of the imprint energy to go through the energy transferring member to the molding material layer for performing imprint molding.

2. The microimprint/nanoimprint device of claim 1, wherein the mold has feature structures of a size smaller than 100 microns.

3. The microimprint/nanoimprint device of claim 1, wherein the mold is a light penetrable mold.

4. The microimprint/nanoimprint device of claim 1, wherein the substrate is one selected from the group consisting of a light penetrable substrate, a silicon substrate, and a glass substrate.

5. The microimprint/nanoimprint device of claim 1, wherein the ultraviolet source is for providing light having a wavelength between $10 \times 10^{-9}$ and $400 \times 10^{-9}$ meters.

6. The microimprint/nanoimprint device of claim 1, wherein the heating source is one selected from the group consisting of an electromagnetic wave source, an electrothermal heating source, an optical radiation heating source, an induction heating source, and a combination thereof.

7. The microimprint/nanoimprint device of claim 6, wherein the electromagnetic wave source is for providing electromagnetic wave having a frequency between 300 KHz and 300 GHz.

8. The microimprint/nanoimprint device of claim 1, wherein the ultraviolet source and the heating source are disposed at a same side or different sides.

9. The microimprint/nanoimprint device of claim 1, wherein the energy transferring member is made of one selected from the group consisting of quartz, glass, polymer, and ceramic.

10. The microimprint/nanoimprint device of claim 1, wherein the energy transferring member is a made of an energy penetrable material.

11. The microimprint/nanoimprint device of claim 10, wherein the energy transferring member is a made of a partly light penetrable material or a completely light penetrable material.

* * * * *